(12) United States Patent
Shin et al.

(10) Patent No.: US 8,171,358 B2
(45) Date of Patent: May 1, 2012

(54) SEMICONDUCTOR DEVICE AND METHOD FOR DRIVING THE SAME

(75) Inventors: Sang-Hoon Shin, Gyeonggi-do (KR); Hyung-Dong Lee, Gyeonggi-do (KR); Jeong-Woo Lee, Gyeonggi-do (KR); Hyang-Hwa Choi, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/614,672

(22) Filed: Nov. 9, 2009

(65) Prior Publication Data

US 2011/0001559 A1    Jan. 6, 2011

(30) Foreign Application Priority Data

Jul. 2, 2009  (KR) .......................... 10-2009-0060351

(51) Int. Cl.
G01R 31/28  (2006.01)
H01L 25/00  (2006.01)

(52) U.S. Cl. ....................................... 714/727; 327/565
(58) Field of Classification Search .................... 327/565
See application file for complete search history.

(56) References Cited

U.S. PATENT DOCUMENTS

| | | | |
|---|---|---|---|
| 4,872,169 A | | 10/1989 | Whetsel, Jr. |
| 5,366,906 A | * | 11/1994 | Wojnarowski et al. ......... 438/17 |
| 6,000,051 A | * | 12/1999 | Nadeau-Dostie et al. .... 714/727 |
| 6,314,539 B1 | * | 11/2001 | Jacobson et al. .............. 714/727 |
| 6,586,921 B1 | * | 7/2003 | Sunter ........................ 324/76.11 |
| 7,545,166 B2 | * | 6/2009 | Yu et al. .......................... 326/38 |
| 2004/0000709 A1 | * | 1/2004 | Delacruz ....................... 257/700 |
| 2008/0288840 A1 | * | 11/2008 | Whetsel ........................ 714/727 |
| 2009/0055563 A1 | * | 2/2009 | Fields et al. .................. 710/105 |

FOREIGN PATENT DOCUMENTS

| | | |
|---|---|---|
| JP | 2003-014819 | 1/2003 |
| JP | 2004-264057 | 9/2004 |
| KR | 10-0174334 | 4/1999 |

OTHER PUBLICATIONS

OPen and Shorts for PCBs Using Boundary-Scan, John Liebengood, 2004, pp. 1-3.*
Notice of Preliminary Rejection issued from Korean Intellectual Property Office on Feb. 24, 2011.
Notice of Allowance issued by the Korean Intellectual Property Office on Dec. 23, 2011.

* cited by examiner

*Primary Examiner* — Jeffrey A Gaffin
*Assistant Examiner* — Guerrier Merant
(74) *Attorney, Agent, or Firm* — IP & T Group LLP

(57) ABSTRACT

A semiconductor device and a method for driving the same rapidly detect failure of a through-semiconductor-chip via and effectively repairing the failure using a latching unit assigned to each through-semiconductor-chip via. The semiconductor device includes a plurality of semiconductor chips that are stacked, and a plurality of through-semiconductor-chip vias to commonly transfer a signal to the plurality of semiconductor chips, wherein each of the semiconductor chips includes a multiplicity of latching units assigned to the through-semiconductor-chip vias and the multiplicity of latching units of each of the semiconductor chips constructs a boundary scan path including the plurality of through-semiconductor-chip vias to sequentially transfer test data.

13 Claims, 7 Drawing Sheets

SEMICONDUCTOR DEVICE AND METHOD FOR DRIVING THE SAME

CROSS-REFERENCE TO RELATED APPLICATION

The present application claims priority of Korean Patent Application No. 10-2009-0060351, filed on Jul. 2, 2009, which is incorporated herein by reference in its entirety.

BACKGROUND OF THE INVENTION

Exemplary embodiments of the present invention relates to semiconductor design technology, and more particularly, to technology for detecting failure of a through-semiconductor-chip via and repairing the failure.

Various types of package methods have been introduced to highly integrate a semiconductor device. In particular, a chip stacking method for constructing one semiconductor device by stacking a plurality of semiconductor chips uses a through-semiconductor-chip via to commonly transfer a signal to the plurality of semiconductor chips. In general, since the semiconductor chip is fabricated using a silicon wafer, the through-semiconductor-chip via may be referred to as a through silicon via (TSV).

Meanwhile, a repairing process of detecting the failure of the through-semiconductor-chip via and replacing the through-semiconductor-chip via having the failure with a redundancy through via is performed in a process of testing the semiconductor device. For reference, since the through-semiconductor-chip via is connected to the plurality of semiconductor chips to commonly transfer the signal to the plurality of semiconductor chips, a repairing process for a certain semiconductor chip should be performed on all of the plurality of semiconductor chips even though the failure occurs in a portion penetrating the certain semiconductor chip.

Since it takes a lot of time to perform the process of testing the semiconductor device, technology for rapidly detecting and effectively repairing the failure of the through-semiconductor-chip via is desired.

SUMMARY OF THE INVENTION

An embodiment of the present invention is directed to providing a semiconductor device and a method for driving the same, capable of rapidly detecting failure of a through-semiconductor-chip via and effectively repairing the failure using a latching unit assigned to each through-semiconductor-chip via.

In accordance with an aspect of the present invention, a semiconductor device includes a plurality of semiconductor chips that are stacked; and a plurality of through-semiconductor-chip vias to commonly transfer a signal to the plurality of semiconductor chips, wherein each of the semiconductor chips includes a multiplicity of latching units assigned to the through-semiconductor-chip vias and the multiplicity of latching units of each of the semiconductor chips constructs a boundary scan path including the plurality of through-semiconductor-chip vias to sequentially transfer test data.

In accordance with another aspect of the present invention, a semiconductor device includes a plurality of semiconductor chips that are stacked; and a plurality of through-semiconductor-chip vias to commonly transfer a signal to the plurality of semiconductor chips, wherein each of the semiconductor chips includes a multiplicity of latching units that are assigned to the through-semiconductor-chip vias and store test data transmitted through the plurality of through-semiconductor-chip vias, and the multiplicity of latching units of each of the semiconductor chips constructs a boundary scan path including the plurality of through-semiconductor-chip vias to sequentially transfer the test data.

In accordance with yet another embodiment of the present invention, a semiconductor device includes a plurality of semiconductor chips that are stacked; and a plurality of through-semiconductor-chip vias to commonly transfer a signal to the plurality of semiconductor chips, wherein each of the semiconductor chips includes a multiplicity of latching units that are assigned to the through-semiconductor-chip vias and store test data transmitted through the plurality of through-semiconductor-chip vias, and data stored in latching units of a selected one of the semiconductor chips are sequentially transmitted to at least one test-dedicated through-semiconductor-chip via.

In accordance with still another embodiment of the present invention, a semiconductor device includes a plurality of semiconductor chips that are stacked; and a plurality of through-semiconductor-chip vias to commonly transfer a signal to the plurality of semiconductor chips, wherein each of the semiconductor chips includes a multiplicity of latching units that are assigned to the through-semiconductor-chip vias and store test data sequentially transmitted through at least one first test-dedicated through-semiconductor-chip via, and data stored in latching units of a selected one of the semiconductor chips are sequentially transmitted to at least one second test-dedicated through-semiconductor-chip via, wherein the test data stored in latching units of a semiconductor chip neighboring to the selected semiconductor chip are transmitted through the plurality of through-semiconductor-chip vias and stored in the latching units of the selected semiconductor chip.

In accordance with an aspect of the present invention, a method for driving a semiconductor device, the method includes outputting data stored in a first latching unit of a first semiconductor chip to a first through-semiconductor-chip via connecting the first semiconductor chip and a second semiconductor chip in response to a clock signal; and storing the data transmitted through the first through-semiconductor-chip via in a first latching unit of the second semiconductor chip in response to the clock signal.

In accordance with another embodiment of the present invention, a method for driving a semiconductor device, the method includes outputting data stored in a multiplicity of latching units of a first semiconductor chip to a plurality of through-semiconductor-chip vias connecting the first semiconductor chip and a second semiconductor chip in response to a clock signal; storing the data transmitted through the plurality of through-semiconductor-chip vias in a multiplicity of latching units of the second semiconductor chip in response to the clock signal; and sequentially transferring the data stored in the multiplicity of latching units of the second semiconductor chip to a test-dedicated through-semiconductor-chip via in response to the clock signal.

DESCRIPTION OF SPECIFIC EMBODIMENTS

Figure 1:
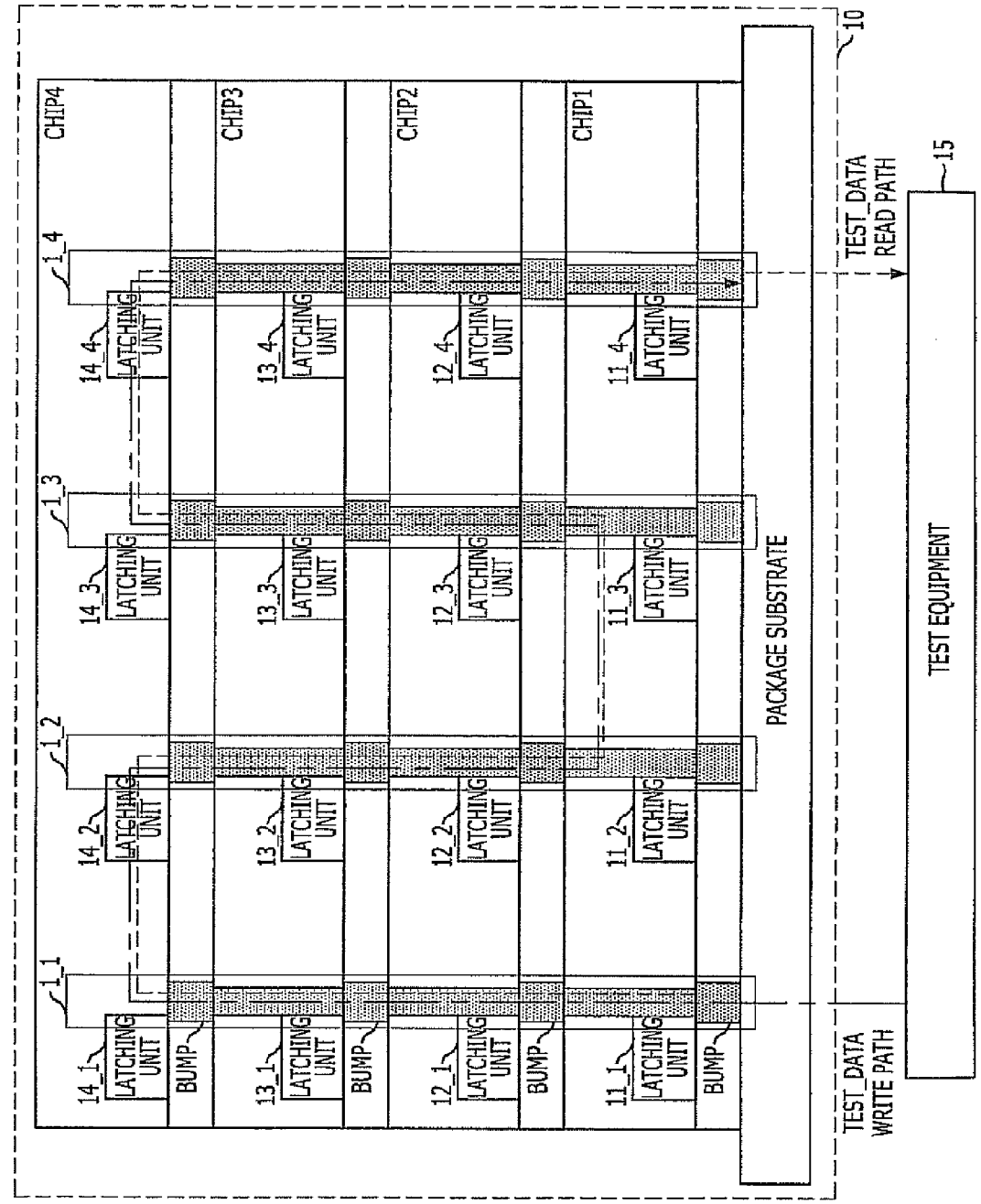
FIG. 1 illustrates a conceptual cross-sectional view of a semiconductor device in accordance with a first embodiment of the present invention.

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Other objects and advantages of the present invention can be understood by the following description, and become apparent with reference to the embodiments of the present invention. For reference, since terms, symbols, reference numerals used to call devices, blocks in the drawings and description may be described by details according to needs and thus the same terms, symbols, reference numerals may not refer to the same devices, blocks over all circuits.

In general, a logic signal of a circuit is classified into a high level and a low level according to its voltage level and represented as '1' or '0'. Moreover, according to needs, the logic signal may have a high impedance (Hi-Z) state. A through-semiconductor-chip via may be subdivided into a transmission line penetrating each semiconductor chip and a bump connecting a transmission line of each semiconductor chip, but the through-semiconductor-chip via in the embodiments of the present invention is defined as being constructed with one physical transmission line penetrating a plurality of semiconductor chips.

FIG. 1 illustrates a conceptual cross-sectional view of a semiconductor device 10 in accordance with a first embodiment of the present invention.

Referring to FIG. 1, the semiconductor device 10 in accordance with the first embodiment includes a plurality of semiconductor chips CHIP1, CHIP2, CHIP3 and CHIP4 and a plurality of through-semiconductor-chip vias 1_1, 1_2, 1_3 and 1_4 for commonly transferring signals to the plurality of semiconductor chips CHIP1, CHIP2, CHIP3 and CHIP4.

Herein, the plurality of semiconductor chips CHIP1, CHIP2, CHIP3 and CHIP4 includes a multiplicity of latching units 11_1 to 11_4, 12_1 to 12_4, 13_1 to 13_4 and 14_1 to 14_4 that is assigned to the plurality of through-semiconductor-chip vias 1_1, 1_2, 1_3 and 1_4. The multiplicity of latching units 11_1 to 11_4, 12_1 to 12_4, 13_1 to 13_4 and 14_1 to 14_4 of the semiconductor chips CHIP1, CHIP2, CHIP3 and CHIP4 constructs a boundary scan path including the plurality of through-semiconductor-chip vias 1_1, 1_2, 1_3 and 1_4 to sequentially transfer test data TEST_DATA. For reference, the boundary scan path represents a path through which data are transferred in a state of a boundary scan test BST. The boundary scan test BST is performed by sequentially providing the test data TEST_DATA to internal circuits to be tested, or outputting states of the internal circuits. In the boundary scan test BST, the data are transferred using components such as shift registers.

In this embodiment, the test data TEST_DATA provided from a test equipment 15 are transferred to the multiplicity of latching units 11_1 to 11_4, 12_1 to 12_4, 13_1 to 13_4 and 14_1 to 14_4 and the boundary scan path formed through the through-semiconductor-chip vias 1_1, 1_2, 1_3 and 1_4 and data outputted through the boundary scan path are sequentially transferred to the test equipment 15. The test equipment 15 detects the failure of the through-semiconductor-chip vias 1_1, 1_2, 1_3 and 1_4 based on the data transferred thereto and repairs the failure. That is, if partial failure occurs at a part of a through-semiconductor-chip via that penetrates a certain semiconductor chip, test data are not transferred to latching units behind the part of the through-semiconductor-chip via where the partial failure occurred. As a result, it is possible to detect the part where the failure of the through-semiconductor-chip via occurred by verifying the test data transmission. For reference, since the through-semiconductor-chip vias 1_1, 1_2, 1_3 and 1_4 physically connect the plurality of semiconductor chips CHIP1, CHIP2, CHIP3 and CHIP4, although the partial failure occurred at the part penetrating the certain semiconductor chip, the repairing process is performed on the corresponding through-semiconductor-chip via in all of the semiconductor chips CHIP1, CHIP2, CHIP3 and CHIP4.

In this embodiment, a test data write path TEST_DATA WRITE PATH and a test data read path TEST_DATA READ PATH use the same boundary scan path. The boundary scan path is constructed by the multiplicity of latching units 11_1 to 11_4, 12_1 to 12_4, 13_1 to 13_4 and 14_1 to 14_4 included in the semiconductor chip CHIP1, CHIP2, CHIP3 and CHIP4 connecting the plurality of through-semiconductor-chip vias 1_1, 1_2, 1_3 and 1_4 with a data transmission chain. That is, the test data TEST_DATA are sequentially transmitted to the first latching unit 11_1 of the first semiconductor chip CHIP1, the first latching unit 12_1 of the second semiconductor chip CHIP2, the first latching unit 13_1 of the third semiconductor chip CHIP3 and the first latching unit 14_1 of the fourth semiconductor chip CHIP4 in transmission through the first through-semiconductor-chip via 1_1. Then, the test data TEST_DATA are sequentially transmitted to the second latching unit 14_2 of the fourth semiconductor chip CHIP4, the second latching unit 13_2 of the third semiconductor chip CHIP3, the second latching unit 12_2 of the second semiconductor chip CHIP2 and the second latching unit 11_2 of the first semiconductor chip CHIP1 in transmission through the second through-semiconductor-chip via 1_2. Subsequently, the test data TEST_DATA are sequentially transmitted to the third latching unit 11_3 of the first semiconductor chip CHIP1, the third latching unit 12_3 of the second semiconductor chip CHIP2, the third latching unit 13_3 of the third semiconductor chip CHIP3 and the third latching unit 14_3 of the fourth semiconductor chip CHIP4 in transmission through the third through-semiconductor-chip via 1_3. After then, the test data TEST_DATA are sequentially transmitted to the fourth latching unit 14_4 of the fourth semiconductor chip CHIP4, the fourth latching unit 13_4 of the third semiconductor chip CHIP3, the fourth latching unit 12_4 of the second semiconductor chip CHIP2 and the fourth latching unit 11_4 of the first semiconductor chip CHIP1 in transmission through the fourth through-semiconductor-chip via 1_4, and finally outputted to the test equipment 15. In general, the test data TEST_DATA are provided from the outside and the data transmitted through the boundary scan path are outputted to the outside. However, in this embodiment, the test data TEST_DATA are provided from the test equipment 15.

As described above, the semiconductor device 10 in accordance with the first embodiment of the present invention, i.e., the is semiconductor device 10 including the plurality of through-semiconductor-chip vias 1_1, 1_2, 1_3 and 1_4 for commonly transferring a signal to the plurality of semiconductor chips CHIP1, CHIP2, CHIP3 and CHIP4 that are stacked, is tested through a step of sequentially transmitting the test data TEST_DATA to the boundary scan path constructed by including the multiplicity of latching units 11_1 to 11_4, 12_1 to 12_4, 13_1 to 13_4 and 14_1 to 14_4 and the plurality of through-semiconductor-chip vias 1_1, 1_2, 1_3 and 1_4, and a step of repairing through-semiconductor-chip via(s) having failure based on the data outputted through the boundary scan path.

Figure 2:
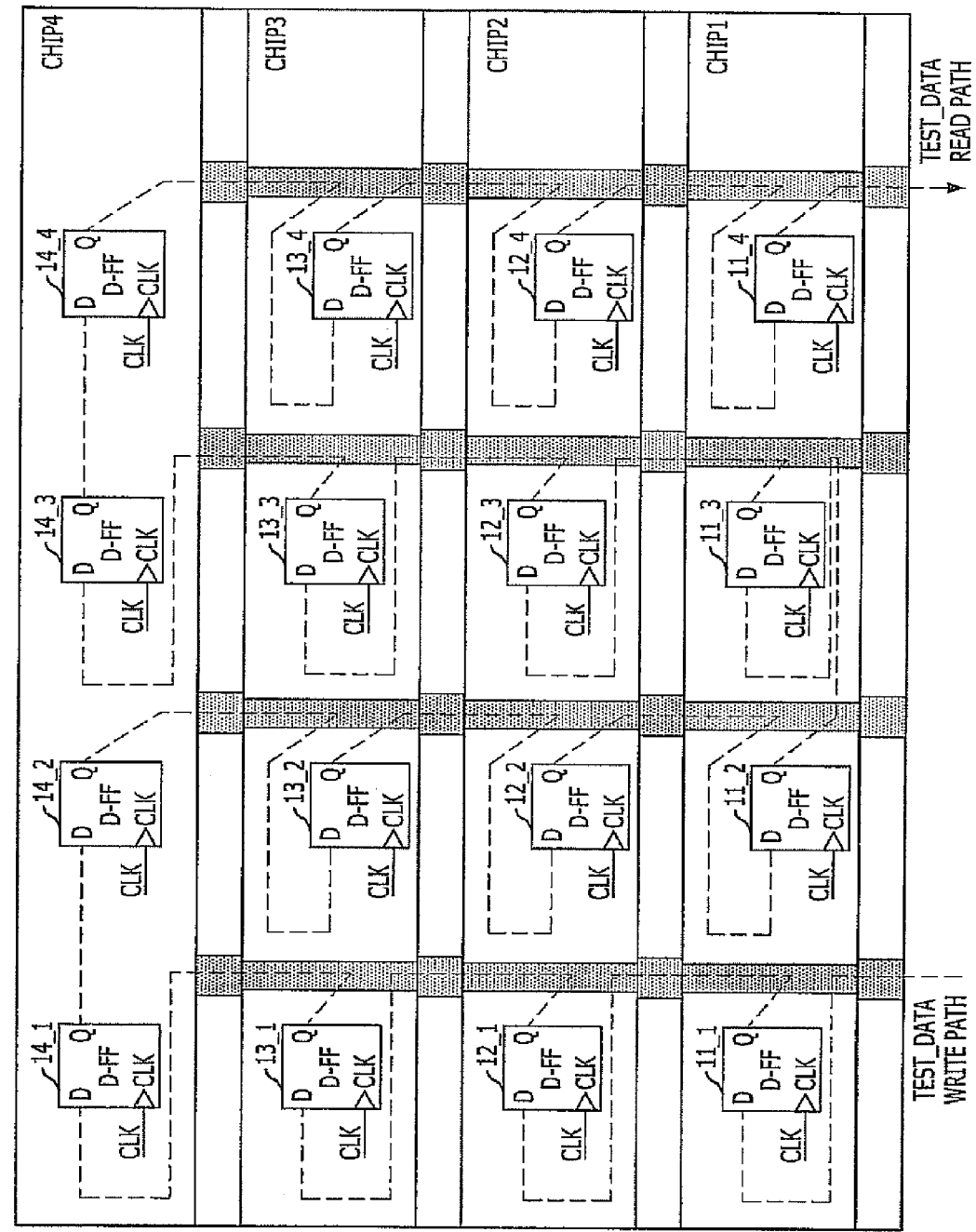
FIG. 2 illustrates a view of internal circuits of the semiconductor device described in FIG. 1.

FIG. 2 illustrates a view of internal circuits of the semiconductor device 10 described in FIG. 1.

Referring to FIG. 2, the latching units 11_1 to 11_4, 12_1 to 12_4, 13_1 to 13_4 and 14_1 to 14_4 are constructed of shift registers that are under the control of a clock signal CLK.

The test data TEST_DATA are sequentially transferred through the boundary scan path constructed of the plurality of through-semiconductor-chip vias 1_1, 1_2, 1_3 and 1_4 and the multiplicity of latching units 11_1 to 11_4, 12_1 to 12_4, 13_1 to 13_4 and 14_1 to 14_4, i.e., the test data write path TEST_DATA WRITE PATH, and stored in the multiplicity of latching units 11_1 to 11_4, 12_1 to 12_4, 13_1 to 13_4 and 14_1 to 14_4. Then, the test data TEST_DATA are sequentially outputted to the outside through the boundary scan path, i.e., the test data read path TEST_DATA READ PATH.

Figure 3:
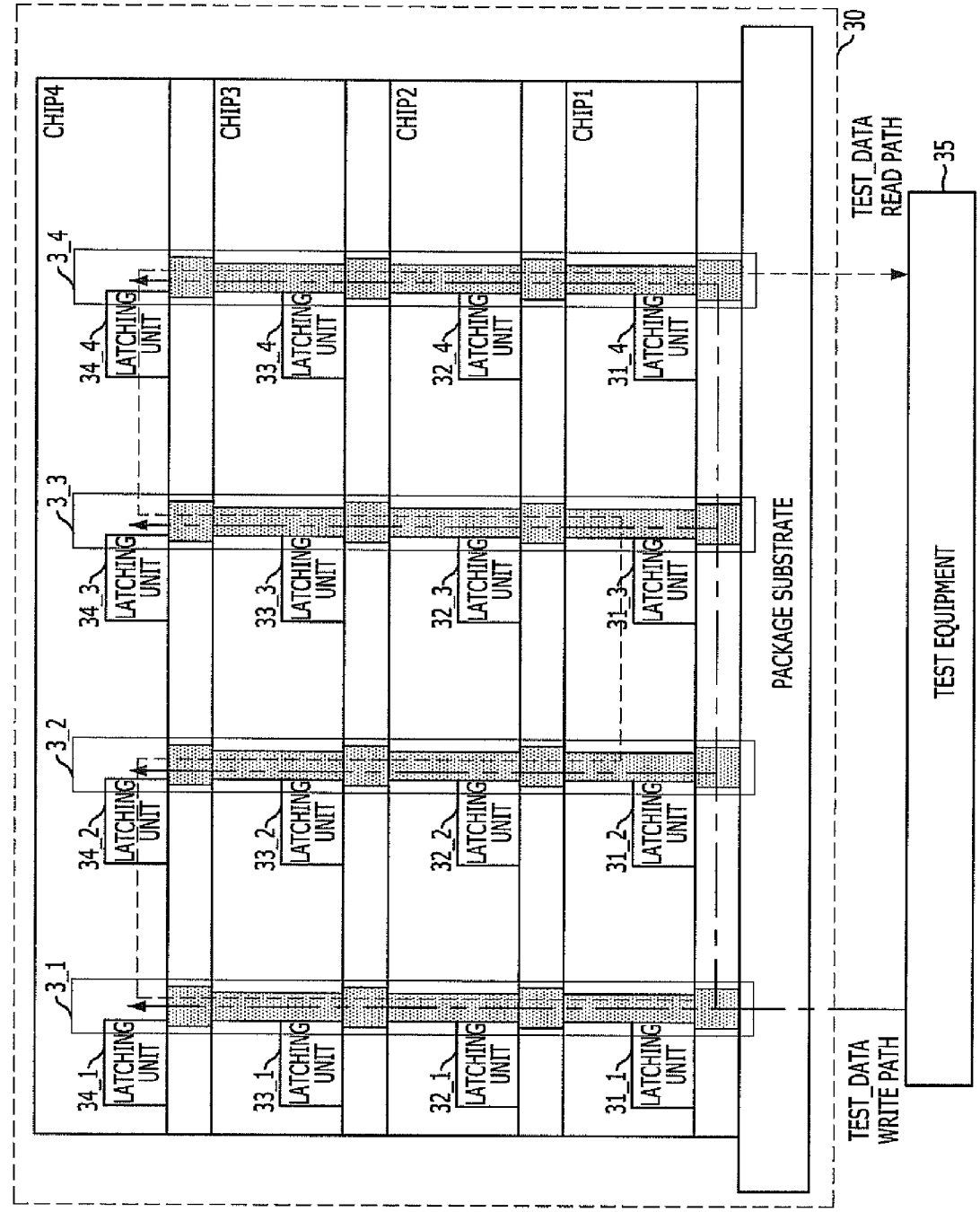
FIG. 3 illustrates a conceptual cross-sectional view of a semiconductor device in accordance with a second embodiment of the present invention.

FIG. 3 illustrates a conceptual cross-sectional view of a semiconductor device 30 in accordance with a second embodiment of the present invention.

Referring to FIG. 3, the semiconductor device 30 in accordance with the second embodiment includes a plurality of semiconductor chips CHIP1, CHIP2, CHIP3 and CHIP4 that are stacked, and a plurality of through-semiconductor-chip vias 3_1, 3_2, 3_3 and 3_4 for commonly transmitting a signal to the plurality of semiconductor chips CHIP1, CHIP2, CHIP3 and CHIP4.

Herein, the semiconductor chips CHIP1, CHIP2, CHIP3 and CHIP4 include a multiplicity of latching units 31_1 to 31_4, 32_1 to 32_4, 33_1 to 33_4 and 34_1 to 34_4 for storing test data TEST_DATA transmitted through the plurality of through-semiconductor-chip vias 3_1, 3_2, 3_3 and 3_4, wherein the multiplicity of latching units 31_1 to 31_4, 32_1 to 32_4, 33_1 to 33_4 and 34_1 to 34_4 is assigned to corresponding through-semiconductor-chip vias. For instance, the latching units 31_1, 32_1, 33_1 and 34_1 are assigned to the through-semiconductor-chip via 3_1 as shown in FIG. 3. The multiplicity of latching units 31_1 to 31_4, 32_1 to 32_4, 33_1 to 33_4 and 34_1 to 34_4 constructs a boundary scan path including the plurality of through-semiconductor-chip vias 3_1, 3_2, 3_3 and 3_4 to sequentially transfer data stored therein. For reference, the boundary scan path represents a path through which data are transferred in a state of a boundary scan test BST. The boundary scan test BST is performed by sequentially providing the test data TEST_DATA to internal circuits to be tested, or outputting states of the internal circuits. In the boundary scan test BST, the data are transferred using such as shift registers.

In this embodiment, the multiplicity of latching units 31_1 to 31_4, 32_1 to 32_4, 33_1 to 33_4 and 34_1 to 34_4 receives and stores the test data TEST_DATA provided from a test equipment 35 through the plurality of through-semiconductor-chip vias 3_1, 3_2, 3_3 and 3_4. The data stored in the latching unit 31_1 to 31_4, 32_1 to 32_4, 33_1 to 33_4 and 34_1 to 34_4 are sequentially transmitted through the boundary scan path constructed by the multiplicity of latching units 31_1 to 31_4, 32_1 to 32_4, 33_1 to 33_4 and 34_1 to 34_4 and the plurality of through-semiconductor-chip vias 3_1, 3_2, 3_3 and 3_4, and the data finally outputted through the boundary scan path are transmitted to the test equipment 35. The test equipment 35 detects the failure of the plurality of through-semiconductor-chip vias 3_1, 3_2, 3_3 and 3_4 based on the data transmitted thereto and repairs the failure. That is, if partial failure occurs at a part of a through-semiconductor-chip via that penetrates a certain semiconductor chip, test data are not transferred to latching units behind (subsequent to) the part of the through-semiconductor-chip via where the partial failure occurred. As a result, it is possible to detect the part where the failure of the through-semiconductor-chip via occurred by verifying the test data transmission. For reference, since the through-semiconductor-chip vias 3_1, 3_2, 3_3 and 3_4 physically connect the plurality of semiconductor chips CHIP1, CHIP2, CHIP3 and CHIP4, although the partial failure occurred at the part penetrating the certain semiconductor chip, the repairing process is performed on the corresponding through-semiconductor-chip via in all of the semiconductor chips CHIP1, CHIP2, CHIP3 and CHIP4.

In this embodiment, a test data write path TEST_DATA WRITE PATH is constructed by a signal transmission path of the plurality of through-semiconductor-chip vias 3_1, 3_2, 3_3 and 3_4. That is, if the test data TEST_DATA are transmitted to the plurality of latching units 31_1 to 31_4 of the first semiconductor chip CHIP1, a test data stored in the first latching unit 31_1 of the first semiconductor chip CHIP1 is sequentially transmitted to the first latching unit 32_1 of the second semiconductor chip CHIP2, the first latching unit 33_1 of the third semiconductor chip CHIP3, and then the first latching unit 34_1 of the fourth semiconductor chip CHIP4 in transmission through the first through-semiconductor-chip via 3_1 and, stored in the latching units 32_1, 33_1 and 34_1. Moreover, a test data stored in the second latching unit 31_2 of the first semiconductor chip CHIP1 is sequentially transmitted to the second latching unit 32_2 of the second semiconductor chip CHIP2, the second latching unit 33_2 of the third semiconductor chip CHIP3, and then the second latching unit 34_2 of the fourth semiconductor chip CHIP4 in transmission through the second chip through via 3_2, and stored in the latching units 32_2, 33_2 and 34_2. A test data stored in the third latching unit 31_3 of the first semiconductor chip CHIP1 is sequentially transmitted to the third latching unit 32_3 of the second semiconductor chip CHIP2, the third latching unit 33_3 of the third semiconductor chip CHIP3, and then the third latching unit 34_3 of the fourth semiconductor chip CHIP4 in transmission through the third through-semiconductor via 3_3, and stored in the latching units 32_3, 33_3 and 34_3. Furthermore, a test data stored in the fourth latching unit 31_4 of the first semiconductor chip CHIP1 is sequentially transmitted to the fourth latching unit 32_4 of the second semiconductor chip CHIP2, the fourth latching unit 33_4 of the third semiconductor chip CHIP3, and then the fourth latching unit 34_4 of the fourth semiconductor chip CHIP4 in transmission through the fourth through-semiconductor via 3_4, and stored in the latching units 32_4, 33_4 and 34_4.

A test data read path TEST_DATA READ PATH uses the boundary scan path. The boundary scan path is constructed by the multiplicity of latching units 31_1 to 31_4, 32_1 to 32_4, 33_1 to 33_4 and 34_1 to 34_4 included in the semiconductor chips CHIP1, CHIP2, CHIP3 and CHIP4 connecting the plurality of through-semiconductor-chip vias 3_1, 3_2, 3_3 and 3_4 with a data transmission chain.

The test data TEST_DATA transmitted to the latching units 31_1 to 31_4, 32_1 to 32_4, 33_1 to 33_4 and 34_1 to 34_4 through the test data write path TEST_DATA WRITE PATH and stored in the latching units 31_1 to 31_4, 32_1 to 32_4, 33_1 to 33_4 and 34_1 to 34_4 are sequentially outputted through the test data read path TEST_DATA READ PATH. That is, data stored in corresponding latching units are outputted in order of the fourth latching unit 31_4 of the first semiconductor chip CHIP1, the fourth latching unit 32_4 of the second semiconductor chip CHIP2, the fourth latching unit 33_4 of the third semiconductor chip CHIP3 and the fourth latching unit 34_4 of the fourth semiconductor chip CHIP4. Then, data stored in corresponding latching units are outputted in order of the third latching unit 34_3 of the fourth semiconductor chip CHIP4, the third latching unit 33_3 of the third semiconductor chip CHIP3, the third latching unit 32_3 of the second semiconductor chip CHIP2 and the third latching unit 31_3 of the first semiconductor chip CHIP1. Subsequently, data stored in corresponding latching units are outputted in order of the second latching unit 31_2 of the first semiconductor chip CHIP1, the second latching unit 32_2 of the second semiconductor chip CHIP2, the second latching unit 33_2 of the third semiconductor chip CHIP3 and the second latching unit 34_2 of the fourth semiconductor chip CHIP4. After then, data stored in corresponding latching units are outputted in order of the first latching unit 34_1 of the fourth semiconductor chip CHIP4, the first latching unit 33_1 of the third semiconductor chip CHIP3, the first latching unit 32_1 of the second semiconductor chip CHIP2 and the first latching unit 31_1 of the first semiconductor chip CHIP1. The outputted data are finally transmitted to the test equipment 35. In general, the test data TEST_DATA are provided from the outside and the data transmitted through the boundary scan path are outputted to the outside. However, in this embodiment, the test data TEST_DATA are provided from the test equipment 35.

As described above, the semiconductor device 30 in accordance with the second embodiment, i.e., the semiconductor device 30 including the plurality of through-semiconductor-chip vias 3_1, 3_2, 3_3 and 3_4 for commonly transferring a signal to the plurality of semiconductor chips CHIP1, CHIP2, CHIP3 and CHIP4 that are stacked, is tested through a step of storing the test data TEST_DATA transmitted through the plurality of through-semiconductor-chip vias 3_1, 3_2, 3_3 and 3_4 in the multiplicity of latching units 31_1 to 31_4, 32_1 to 32_4, 33_1 to 33_4 and 34_1 to 34_4 of the semiconductor chips CHIP1, CHIP2, CHIP3 and CHIP4, wherein the latching units 31_1 to 31_4, 32_1 to 32_4, 33_1 to 33_4 and 34_1 to 34_4 are assigned to corresponding through-semiconductor-chip vias as shown in FIG. 3, a step of sequentially transmitting the data stored in each latching unit through the boundary scan path constructed by including the multiplicity of latching units 31_1 to 31_4, 32_1 to 32_4, 33_1 to 33_4 and 34_1 to 34_4 and the plurality of through-semiconductor-chip vias 3_1, 3_2, 3_3 and 3_4, and a step of repairing through-semiconductor-chip via(s) having failure based on the data outputted through the boundary scan path.

Figure 4:
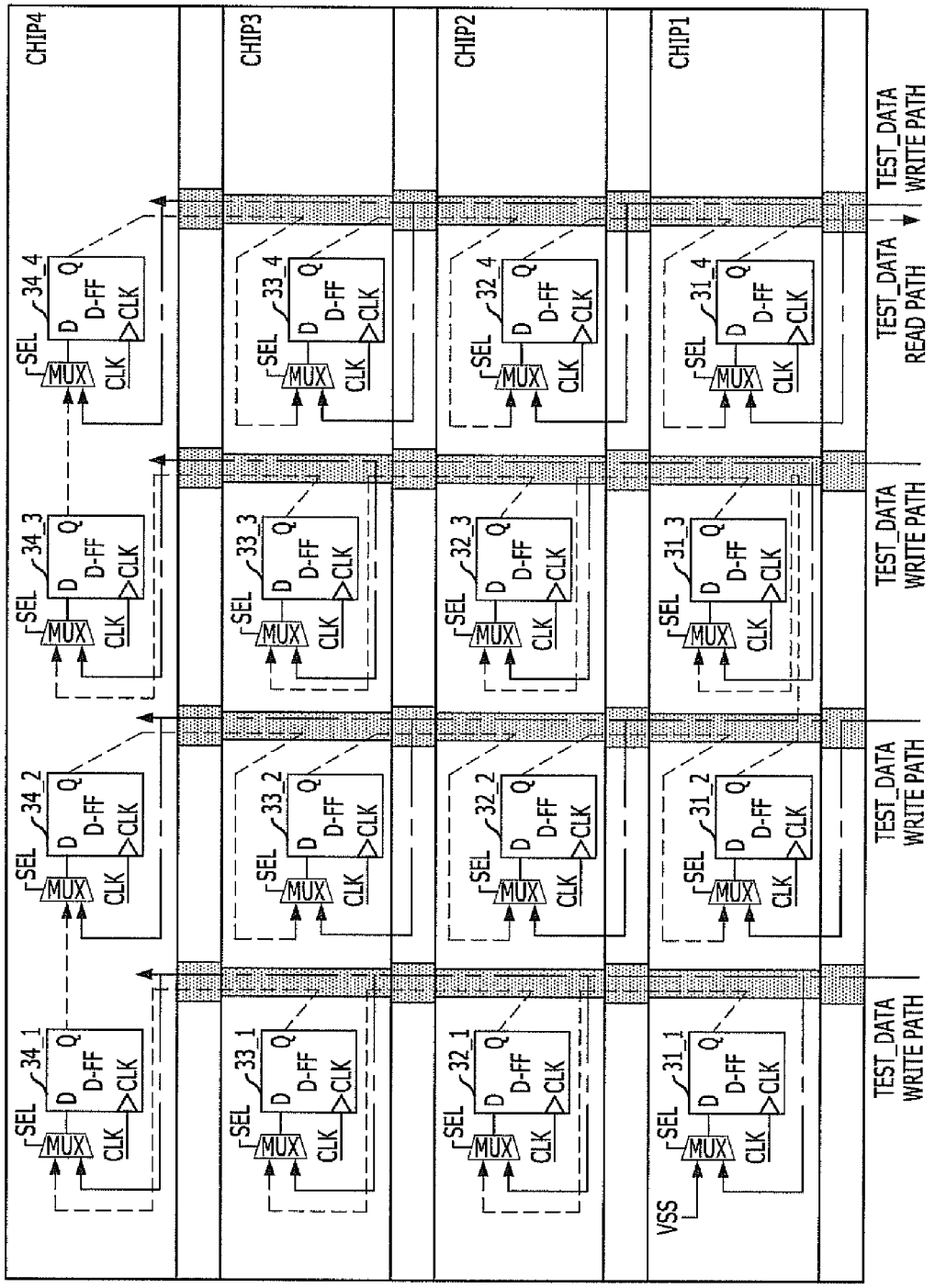
FIG. 4 illustrates a view of internal circuits of the semiconductor device described in FIG. 3.

FIG. 4 illustrates a view of internal circuits of the semiconductor device 30 described in FIG. 3.

Referring to FIG. 4, the multiplicity of latching units 31_1 to 31_4, 32_1 to 32_4, 33_1 to 33_4 and 34_1 to 34_4 is constructed of shift registers that are under the control of a clock signal CLK.

Each latching unit has an input terminal D receiving data through a multiplexer MUX that is controlled by a selection signal SEL. For instance, if the selection signal SEL has a low level, each multiplexer MUX transmits the test data TEST_DATA transferred through the test data write path TEST_DATA WRITE PATH to an input terminal D of a corresponding latching unit. In the meantime, if the selection signal SEL has a high level, the multiplexer MUX transfers data outputted from a latching unit connected through the boundary scan path, i.e., the test data read path TEST_DATA READ PATH, to the input terminal D of the corresponding latching unit.

For reference, in the semiconductor devices in accordance with the first and second embodiments of the present invention, since the through-semiconductor-chip vias to be tested are included in the test data read path TEST_DATA READ PATH, a testing time may be increased according to the failure of the through-semiconductor-chip vias. However, the test data write path TEST_DATA WRITE PATH and the test data read path TEST_DATA READ PATH use the same boundary scan path unless they are separately formed.

Figure 5:
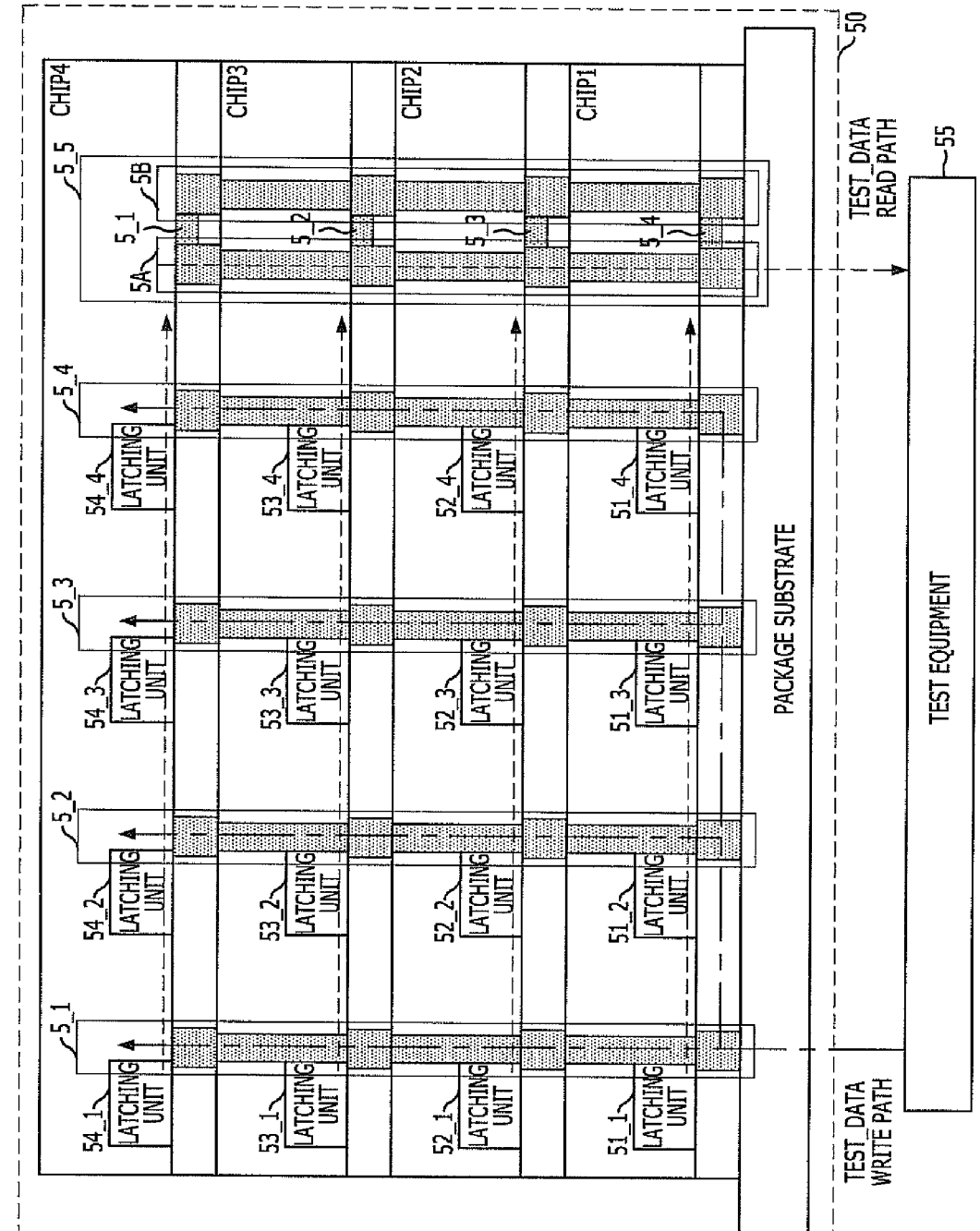
FIG. 5 illustrates a conceptual cross-sectional view of a semiconductor device in accordance with a third embodiment of the present invention.

FIG. 5 illustrates a conceptual cross-sectional view of a semiconductor device 50 in accordance with a third embodiment of the present invention.

Referring to FIG. 5, the semiconductor device 50 in accordance with the third embodiment includes a plurality of semiconductor chips CHIP1, CHIP2, CHIP3 and CHIP4 that are stacked, and a plurality of through-semiconductor-chip vias 5_1, 5_2, 5_3 and 5_4 for commonly transferring a signal to the plurality of semiconductor chips CHIP1, CHIP2, CHIP3 and CHIP4.

Herein, the plurality of semiconductor chips CHIP1, CHIP2, CHIP3 and CHIP4 includes a multiplicity of latching units 51_1 to 51_4, 52_1 to 52_4, 53_1 to 53_4 and 54_1 to 54_4 for storing test data TEST_DATA transmitted through the plurality of through-semiconductor-chip vias 5_1, 5_2, 5_3 and 5_4, wherein the multiplicity of latching units 51_1 to 51_4, 52_1 to 52_4, 53_1 to 53_4 and 54_1 to 54_4 is assigned to corresponding through-semiconductor-chip vias. Data stored in latching units of a selected semiconductor chip are sequentially outputted through at least one test-dedicated through-semiconductor-chip via 5_5.

In this embodiment, the multiplicity of latching units 51_1 to 51_4, 52_1 to 52_4, 53_1 to 53_4 and 54_1 to 54_4 receives and stores the test data TEST_DATA provided from a test equipment 55 through the plurality of through-semiconductor-chip vias 5_1, 5_2, 5_3 and 5_4. Data stored in the latching units of each semiconductor chip are sequentially transmitted to the test-dedicated through-semiconductor-chip via 5_5 and the data finally outputted through the through-semiconductor-chip via 5_5 are transferred to the test equipment 55. The test equipment 55 detects the failure of the plurality of through-semiconductor-chip vias 5_1, 5_2, 5_3 and 5_4 based on the data transmitted thereto and repairs the failure. That is, if partial failure occurs at a part of a through-semiconductor-chip via that penetrates a certain semiconductor chip, test data are not transferred to latching units behind the part of the through-semiconductor-chip via where the partial failure occurred. As a result, it is possible to detect the part where the failure of the through-semiconductor-chip via occurred by verifying the test data transmission. For reference, since the through-semiconductor-chip vias 5_1, 5_2, 5_3 and 5_4 physically connect the plurality of semiconductor chips CHIP1, CHIP2, CHIP3 and CHIP4, although the partial failure occurred at the part penetrating the certain semiconductor chip, the repairing process should be performed on the corresponding through-semiconductor-chip via in all of the semiconductor chips CHIP1, CHIP2, CHIP3 and CHIP4.

In this embodiment, a test data write path TEST_DATA WRITE PATH is constructed by a signal transmission path of the plurality of through-semiconductor-chip vias 5_1, 5_2, 5_3 and 5_4. That is, if the test data TEST_DATA are transmitted to the latching units 51_1 to 51_4 of the first semiconductor chip CHIP1, a test data stored in the first latching unit 51_1 of the first semiconductor chip CHIP1 is sequentially transmitted to the first latching unit 52_1 of the second semiconductor chip CHIP2, the first latching unit 53_1 of the third semiconductor chip CHIP3, and then the first latching unit 54_1 of the fourth semiconductor chip CHIP4 through the first through-semiconductor-chip via 5_1 and, stored in the latching units 52_1, 53_1 and 54_1. Moreover, a test data stored in the second latching unit 51_2 of the first semiconductor chip CHIP1 is sequentially transmitted to the second latching unit 52_2 of the second semiconductor chip CHIP2, the second latching unit 53_2 of the third semiconductor chip CHIP3, and then the second latching unit 54_2 of the fourth semiconductor chip CHIP4 through the second chip through via 5_2, and stored in the latching units 52_2, 53_2 and 54_2. A test data stored in the third latching unit 51_3 of the first semiconductor chip CHIP1 is sequentially transmitted to the third latching unit 52_3 of the second semiconductor chip CHIP2, the third latching unit 53_3 of the third semiconductor chip CHIP3, and then the third latching unit 54_3 of the fourth semiconductor chip CHIP4 in transmission through the third through-semiconductor via 5_3, and stored in the latching units 52_3, 53_3 and 54_3. Furthermore, a test data stored in the fourth latching unit 51_4 of the first semiconductor chip CHIP1 is sequentially transmitted to the fourth latching unit 52_4 of the second semiconductor chip CHIP2, the fourth latching unit 53_4 of the third semiconductor chip CHIP3, and then the fourth latching unit 54_4 of the fourth semiconductor chip CHIP4 in transmission through the fourth through-semiconductor via 5_4, and stored in the latching units 52_4, 53_4 and 54_4.

In this embodiment, a test data read path TEST_DATA READ PATH is constructed of a multiplicity of latching units included in a corresponding semiconductor chip. Accordingly, the test data TEST_DATA transmitted to the latching units 51_1 to 51_4, 52_1 to 52_4, 53_1 to 53_4 and 54_1 to 54_4 through the test data write path TEST_DATA WRITE PATH and stored in the latching units 51_1 to 51_4, 52_1 to 52_4, 53_1 to 53_4 and 54_1 to 54_4 are sequentially outputted through the test data read path TEST_DATA READ PATH.

Namely, the data stored in the latching units 51_1 to 51_4 of the first semiconductor chip CHIP1 are sequentially transferred to the test-dedicated through-semiconductor-chip via 5_5. The data stored in the latching units 52_1 to 52_4 of the second semiconductor chip CHIP2 are sequentially transmitted to the test-dedicated through-semiconductor-chip via 5_5 and the test equipment 55 repairs parts of the through-semiconductor-chip vias corresponding to the first semiconductor chip CHIP1 based on the data transmitted thereto. Furthermore, the data stored in the latching units 53_1 to 53_4 of the third semiconductor chip CHIP3 are sequentially transmitted to the test-dedicated through-semiconductor-chip via 5_5 and the test equipment 55 repairs parts of the through-semiconductor-chip vias corresponding to the second semiconductor chip CHIP2 based on the data transmitted thereto. The data stored in the latching units 54_1 to 54_4 of the fourth semiconductor chip CHIP4 are sequentially transmitted to the test-dedicated through-semiconductor-chip via 5_5 and the test equipment 55 repairs parts of the through-semiconductor-chip vias corresponding to the third semiconductor chip CHIP3 based on the data transmitted thereto.

For reference, in this embodiment, the test-dedicated through-semiconductor-chip via 5_5 sequentially transferring the data to the outside is constructed of a plurality of through-semiconductor-chip vias 5A and 5B connected in a multi-parallel scheme through the plurality of through-semiconductor-chip vias 5_1, 5_2, 5_3 and 5_4. Therefore, the reliability for exactly transferring signals is much more increased. However, since the parallel-connection scheme requires a large area, the test-dedicated through-semiconductor-chip via may be constructed using single or parallel connection according to the needs. Moreover, in order to improve the data transmission ability, data may be transmitted through a plurality of test-dedicated through-semiconductor-chip vias. In general, the test data TEST_DATA are provided from the outside and the data transmitted through the through-semiconductor-chip via 5_5 are outputted to the outside. However, in this embodiment, the test data TEST_DATA are provided from the test equipment 55.

As described above, the semiconductor device 50 in accordance with the fourth embodiment, i.e., the semiconductor device 50 including the plurality of through-semiconductor-chip vias 5_1, 5_2, 5_3 and 5_4 for commonly transmitting a signal to the plurality of semiconductor chips CHIP1, CHIP2, CHIP3 and CHIP4 that are stacked, is tested through a step of storing the test data TEST_DATA transmitted through the plurality of through-semiconductor-chip vias 5_1, 5_2, 5_3 and 5_4 in the multiplicity of latching units 52_1 to 52_4 of the second semiconductor chip CHIP2, wherein the latching units 52_1 to 52_4 are assigned to the through-semiconductor-chip vias 5_1, 5_2, 5_3 and 5_4, respectively, as shown in FIG. 5, a step of sequentially outputting the data stored in the latching units 52_1 to 52_4 of the second semiconductor chip CHIP2 through the test-dedicated through-semiconductor-chip via 5_5, a step of repairing parts of the through-semiconductor-chip vias corresponding to the first semiconductor chip CHIP1 based on the data outputted through the test-dedicated through-semiconductor-chip via 5_5, a step of storing the test data TEST_DATA transmitted through the plurality of through-semiconductor-chip vias 5_1, 5_2, 5_3 and 5_4 in the latching units 53_1 to 53_4 of the third semiconductor chip CHIP3, wherein the latching units 53_1 to 53_4 are assigned to the through-semiconductor-chip vias 5_1, 5_2, 5_3 and 5_4, respectively, a step of sequentially outputting the data stored in the latching units 53_1 to 53_4 of the third semiconductor chip CHIP3 through the test-dedicated through-semiconductor-chip via 5_5, a step of repairing parts of the through-semiconductor-chip vias corresponding to the second semiconductor chip CHIP2 based on the data outputted through the test-dedicated through-semiconductor-chip via 5_5, a step of storing the test data TEST_DATA transmitted through the plurality of through-semiconductor-chip vias 5_1, 5_2, 5_3 and 5_4 in the latching units 54_1 to 54_4 of the fourth semiconductor chip CHIP4, wherein the latching units 54_1 to 54_4 are assigned to the through-semiconductor-chip vias 5_1, 5_2, 5_3 and 5_4, respectively, a step of sequentially outputting the data stored in the latching units 54_1 to 54_4 of the fourth semiconductor chip CHIP4 through the test-dedicated through-semiconductor-chip via 5_5, and a step of repairing parts of the through-semiconductor-chip vias corresponding to the third semiconductor chip CHIP3 based on the data outputted through the test-dedicated through-semiconductor-chip via 5_5. When testing the semiconductor device by applying the above method, it is possible to simultaneously detect and repair the failure of the plurality of through-semiconductor-chip vias. As a result, a testing speed of the semiconductor device is further enhanced.

Figure 6:
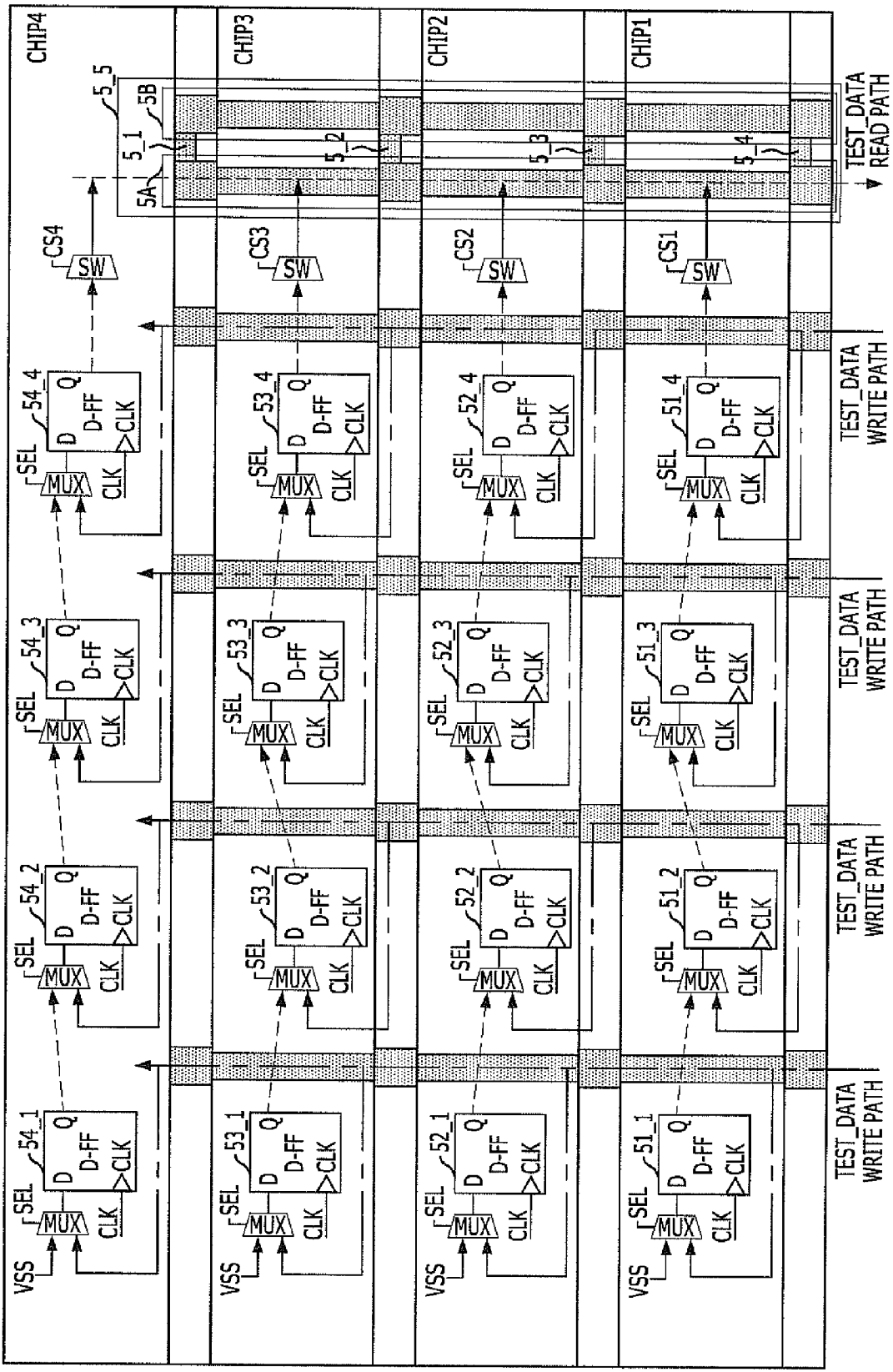
FIG. 6 illustrates a view of internal circuits of the semiconductor device described in FIG. 5.

FIG. 6 illustrates a view of internal circuits of the semiconductor device 50 described in FIG. 5.

Referring to FIG. 6, the multiplicity of latching units 51_1 to 51_4, 52_1 to 52_4, 53_1 to 53_4 and 54_1 to 54_4 is constructed of shift registers that are under the control of a clock signal CLK.

Each of the latching units 51_1 to 51_4, 52_1 to 52_4, 53_1 to 53_4 and 54_1 to 54_4 has an input terminal D receiving data through a multiplexer MUX that is controlled by a selection signal SEL. For instance, if the selection signal SEL has a low level, each multiplexer MUX transmits the test data TEST_DATA transferred through the test data write path TEST_DATA WRITE PATH to an input terminal D of a corresponding latching unit. In the meantime, if the selection signal SEL has a high level, the multiplexer MUX transfers data outputted from a neighboring latching unit to the input terminal D of the corresponding latching unit, wherein the neighboring latching unit and the corresponding latching unit are in the same semiconductor chip. That is, the latching units 51_1 to 51_4 of the first semiconductor chip CHIP1 are constructed of shift registers that are controlled by the clock signal CLK and, if a first semiconductor chip selection signal CS1 is enabled, the data stored in the latching units 51_1 to 51_4 are outputted to the outside through the test-dedicated through-semiconductor-chip via 5_5. The latching units 52_1 to 52_4 of the second semiconductor chip CHIP2 are also constructed of shift registers that are controlled by the clock signal CLK and, if a second semiconductor chip selection signal CS2 is enabled, the data stored in the latching units 52_1 to 52_4 are outputted to the outside through the test-dedicated through-semiconductor-chip via 5_5. The latching units 53_1 to 53_4 of the third semiconductor chip CHIP3 are also constructed of shift registers that are controlled by the clock signal CLK and, if a third semiconductor chip selection signal CS3 is enabled, the data stored in the latching units 53_1 to 53_4 are outputted to the outside through the test-dedicated through-semiconductor-chip via 5_5. The latching units 54_1 to 54_4 of the fourth semiconductor chip CHIP4 are constructed of shift registers controlled by the clock signal CLK and, if a fourth semiconductor chip selection signal CS4 is enabled, the data stored in the latching units 54_1 to 54_4 are outputted to the outside through the test-dedicated through-semiconductor-chip via 5_5.

Figure 7:
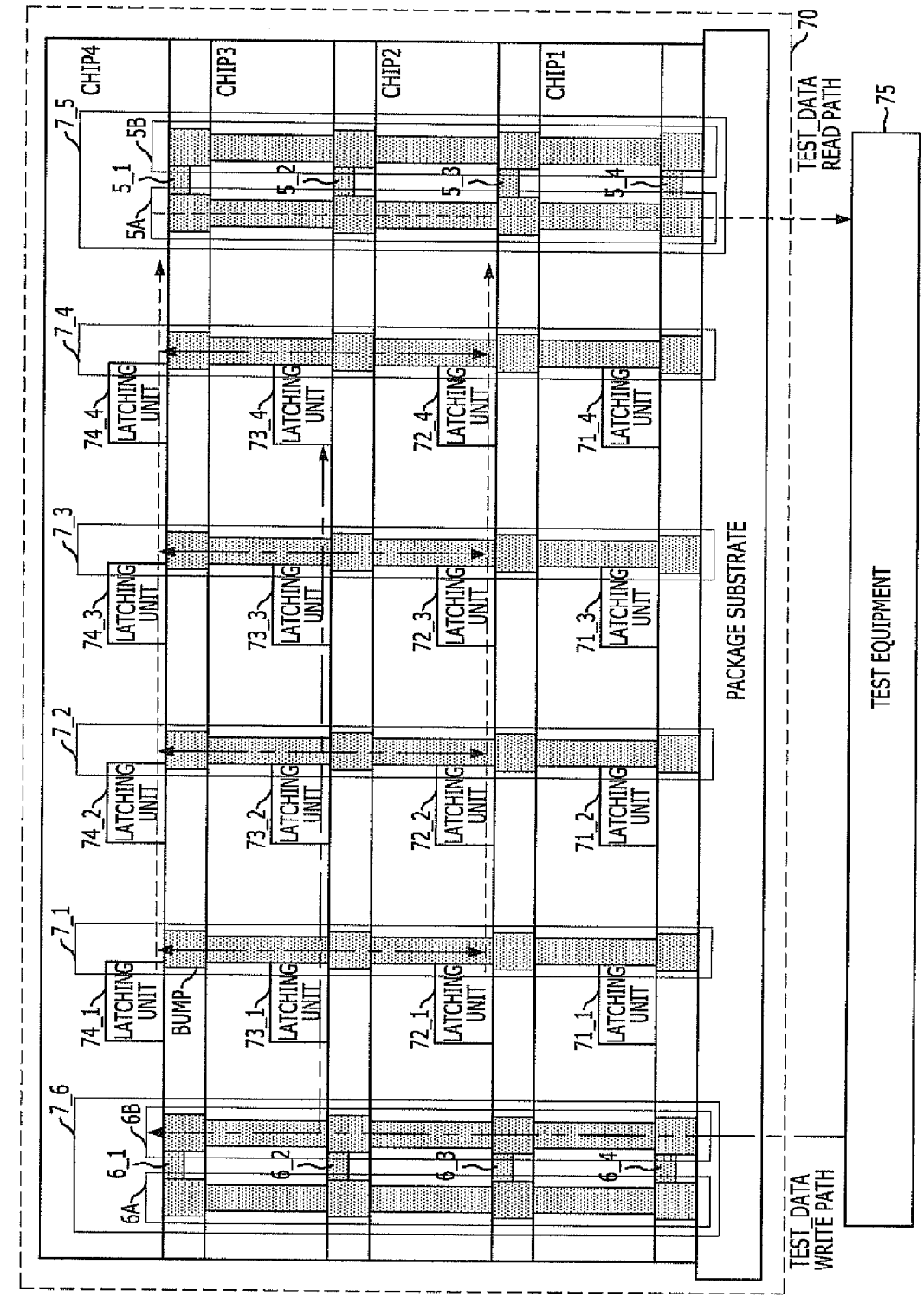
FIG. 7 illustrates a conceptual cross-sectional view of a semiconductor device in accordance with a fourth embodiment of the present invention.

FIG. 7 illustrates a conceptual cross-sectional view of a semiconductor device 70 in accordance with a fourth embodiment of the present invention.

Referring to FIG. 7, the semiconductor device 70 in accordance with the fourth embodiment includes a plurality of semiconductor chips CHIP1, CHIP2, CHIP3 and CHIP4 that are stacked, and a plurality of through-semiconductor-chip vias 7_1, 7_2, 7_3 and 7_4 for commonly transferring a signal to the plurality of semiconductor chips CHIP1, CHIP2, CHIP3 and CHIP4.

Herein, the plurality of semiconductor chips CHIP1, CHIP2, CHIP3 and CHIP4 includes a multiplicity of latching units 71_1 to 71_4, 72_1 to 72_4, 73_1 to 73_4 and 74_1 to 74_4 for storing test data TEST_DATA sequentially transmitted through at least one first test-dedicated through-semiconductor-chip via 7_6, wherein the multiplicity of latching units 71_1 to 71_4, 72_1 to 72_4, 73_1 to 73_4 and 74_1 to 74_4 is assigned to the corresponding through-semiconductor-chip vias 7_1, 7_2, 7_3 and 7_4, respectively, as shown in FIG. 7. Data stored in latching units of a selected semiconductor chip are sequentially outputted through at least one second test-dedicated through-semiconductor-chip via 7_5, wherein the data stored in the latching units of the selected semiconductor chip are provided through the plurality of through-semiconductor-chip vias 7_1, 7_2, 7_3 and 7_4 from its neighboring semiconductor chip whose latching units store the test data TEST_DATA.

In this embodiment, the multiplicity of latching units 71_1 to 71_4, 72_1 to 72_4, 73_1 to 73_4 and 74_1 to 74_4 receives and stores the test data TEST_DATA provided from a test equipment 75 through the first test-dedicated through-semiconductor-chip via 7_6. The test data TEST_DATA stored in the latching units of each semiconductor chip are transmitted to and stored in latching units of its neighboring through-semiconductor-chip the plurality of through-semiconductor-chip vias 7_1, 7_2, 7_3 and 7_4, and the data stored in the latching units are sequentially transmitted to the second test-dedicated through-semiconductor-chip via 7_5. The data finally outputted through the second test-dedicated through-semiconductor-chip via 7_5 are transmitted to the test equipment 75 and the test equipment 75 detects and repairs the failure of the plurality of through-semiconductor-chip vias 7_1, 7_2, 7_3 and 7_4 based on the data transmitted thereto. That is, if partial failure occurs at a part of a through-semiconductor-chip via that penetrates a certain semiconductor chip, test data are not transferred to latching units behind the part of the through-semiconductor-chip via where the partial failure occurred. As a result, it is possible to detect the part where the failure of the through-semiconductor-chip via occurred by verifying the test data transmission. For reference, since the through-semiconductor-chip vias 7_1, 7_2, 7_3 and 3_4 physically connect the plurality of semiconductor chips CHIP1, CHIP2, CHIP3 and CHIP4, although the partial failure occurred at the part penetrating the certain semiconductor chip, the repairing process should be performed on the corresponding through-semiconductor-chip via in all of the semiconductor chips CHIP1, CHIP2, CHIP3 and CHIP4.

In this embodiment, a test data write path TEST_DATA WRITE PATH is selectively constructed through a signal transmission path of the first test-dedicated through-semiconductor-chip via 7_6. For instance, it is assumed that the test data TEST_DATA are transmitted to the latching units 73_1 to 73_4 of the third semiconductor chip CHIP3 through the first test-dedicated through-semiconductor-chip via 7_6 and stored in the latching units 73_1 to 73_4. The test data TEST_DATA stored in the latching units 73_1 to 73_4 of the third semiconductor chip CHIP3 can be selectively transmitted to the latching units 72_1 to 72_4 of the second semiconductor chip CHIP2 or the latching units 74_1 to 74_4 of the fourth semiconductor chip CHIP4 through the plurality of through-semiconductor-chip vias 7_1, 7_2, 7_3 and 7_4. Therefore, the test data write path TEST_DATA WRITE PATH is constructed according to a path where the test data TEST_DATA are transmitted.

In the meantime, when the test data TEST_DATA stored in the latching units 73_1 to 73_4 of the third semiconductor chip CHIP3 are transmitted to the latching units 74_1 to 74_4 of the fourth semiconductor chip CHIP4, a test data read path TEST_DATA READ PATH is constructed by the latching units 74_1 to 74_4 of the fourth semiconductor chip CHIP4. Therefore, the data stored in the latching units 74_1 to 74_4 of the fourth semiconductor chip CHIP4 are sequentially transmitted to the second test-dedicated through-semiconductor-chip via 7_5 and the test equipment 75 repairs parts of the through-semiconductor-chip vias corresponding to the third semiconductor chip CHIP3 based on the data transmitted thereto.

For reference, in this embodiment, the first test-dedicated through-semiconductor-chip via 7_6 sequentially transferring the data to the outside is constructed of a plurality of through-semiconductor-chip vias 6A and 6B connected in a multi-parallel scheme through a plurality of connection lines 6_1, 6_2, 6_3 and 6_4. Moreover, the second test-dedicated through-semiconductor-chip via 7_5 is also constructed of a plurality of through-semiconductor-chip vias 5A and 5B connected in the multi-parallel scheme through a plurality of connection lines 5_1, 5_2, 5_3 and 5_4. Therefore, the reliability for exactly transferring signals is much more increased. However, the parallel-connection scheme requires a large area, the test-dedicated through-semiconductor-chip vias may be constructed using single or parallel connection according to the needs. Moreover, in order to improve the data transmission ability, it is possible to transfer data through a plurality of test-dedicated through-semiconductor-chip vias. In general, the test data TEST_DATA are provided from the outside through the first test-dedicated through-semiconductor-chip via 7_6 and the data transmitted through the second test-dedicated through-semiconductor-chip via 7_5 are outputted to the outside. However, in this embodiment, the test data TEST_DATA are provided from the test equipment 75.

As described above, the semiconductor device, i.e., the semiconductor device 70 including the plurality of through-semiconductor-chip vias 7_1, 7_2, 7_3 and 7_4 for commonly transmitting a signal to the plurality of semiconductor chips CHIP1, CHIP2, CHIP3 and CHIP4 that are stacked, is tested through a step of storing the test data TEST_DATA transmitted through the first test-dedicated through-semiconductor-chip via 7_6 in the latching units 73_1 to 73_4 of the third semiconductor chip CHIP3, wherein the latching units 73_1 to 73_4 are assigned to the corresponding through-semiconductor-chip vias 7_1, 7_2, 7_3 and 7_4, respectively, a step of transferring the test data TEST_DATA stored in the latching units 73_1 to 73_4 of the third semiconductor chip CHIP3 to the latching units 74_1 to 74_4 of the fourth semiconductor chip CHIP4 through the plurality of through-semiconductor-chip vias 7_1, 7_2, 7_3 and 7_4, a step of sequentially outputting the data stored in the latching units 74_1 to 74_4 of the fourth semiconductor chip CHIP4 through the second test-dedicated through-semiconductor-chip via 7_5, and a step of repairing parts of the through-semiconductor-chip vias corresponding to the third semiconductor chip CHIP3 based on the data outputted through the second test-dedicated through-semiconductor-chip via 7_5. When testing the semiconductor device by applying the above method, it is possible to simultaneously detect and repair the failure of the plurality of through-semiconductor-chip vias. As a result, a testing speed of the semiconductor device is further enhanced. Furthermore, the testing order of the plurality of semiconductor chips CHIP1, CHIP2, CHIP3 and CHIP4 may be determined arbitrarily.

For reference, in the semiconductor devices in accordance with the third and fourth embodiments of the present invention, the test data write path TEST_DATA WRITE PATH and the test data read path TEST_DATA READ PATH are separately constructed from each other. Since the test data read path TEST_DATA READ PATH does not include through-semiconductor-chip vias that are targets to be tested, it is possible to rapidly test the semiconductor device regardless of the failure of the through-semiconductor-chip vias.

Meanwhile, the semiconductor devices in accordance with the first to fourth embodiments of the present invention use few channels of the test equipment when performing the test operation. That is, since the test data have the same data value in general, there are only required a test channel of a semiconductor equipment for providing the test data and a test channel of the semiconductor equipment for receiving data outputted from the semiconductor device. Therefore, it is possible to test a lot of semiconductor devices at the same time by using one test equipment.

The semiconductor device in accordance with the present invention can rapidly detect the failure of through-semiconductor-chip vias using latching units assigned to each through-semiconductor-chip via and effectively repair the through-semiconductor-chip vias based on failure detection results.

Moreover, the semiconductor device in accordance with the present invention uses few channels of the test equipment when performing the test operation. Therefore, a lot of semiconductor devices can be tested at the same time through the use of one test equipment.

While the present invention has been described with respect to the specific embodiments, it will be apparent to those skilled in the art that various changes and modifications may be made without departing from the spirit and scope of the invention as defined in the following claims. For instance, the construction of an active high or active low for representing an activation state of a signal and a circuit may be changed according to an embodiment of the present invention. Further, the construction of transistors may be changed according to needs to implement the same function. The construction of a PMOS transistor and an NMOS transistor is exchangeable and various transistors can be used according to needs. The construction of a logic gate is also changeable according to needs to implement the same function. That is, a logic circuit such as a negative logical product unit and a negative logical sum unit may be constructed with various combinations of a NAND gate, a NOR gate, an inverter and so on. Since the change of the circuit can be performed in various manners and the circuit change is apparent to those skilled in the art, the listing for the manners of changing the circuit is omitted.

What is claimed is:

1. A semiconductor device, comprising:
a plurality of semiconductor chips that are stacked; and
a plurality of through-semiconductor-chip vias configured to transfer test data to the plurality of semiconductor chips,
wherein the semiconductor chips each include a plurality of latching units assigned to the through-semiconductor-chip vias and the plurality of latching units of the semiconductor chips form a boundary scan path to transfer the test data, wherein the boundary scan path includes the plurality of through-semiconductor-chip vias,
wherein the plurality of latching units are each coupled to receive, from a respective one of the plurality of through-semiconductor-chip vias, the test data through a signal path extending from the respective through-semiconductor-chip via and the signal path does not pass through any of the plurality of latching units.

2. The semiconductor device of claim 1, wherein the plurality of latching units each comprise a shift register controlled by a clock signal.

3. A semiconductor device, comprising:
a plurality of semiconductor chips that are stacked; and
a plurality of through-semiconductor-chip vias configured to transfer test data to the plurality of semiconductor chips,
wherein the semiconductor chips each include a plurality of latching units that are assigned to the through-semiconductor-chip vias and store the test data transferred through the plurality of through-semiconductor-chip vias and the plurality of latching units of the semiconductor chips form a boundary scan path to transfer the test data, wherein the boundary scan path includes the plurality of through-semiconductor-chip vias, wherein the plurality of latching units are each coupled to receive, from a respective one of the plurality of through-semiconductor-chip vias, the test data through a signal path extending from the respective through-semiconductor-chip via and the signal path does not pass through any of the plurality of latching units.

4. The semiconductor device of claim 3, wherein the plurality of latching units each comprise a shift register controlled by a clock signal.

5. A semiconductor device, comprising:
a plurality of semiconductor chips that are stacked; and
a plurality of through-semiconductor-chip vias configured to transfer test data to the plurality of semiconductor chips,
wherein the semiconductor chips each include a plurality of latching units that are assigned to the through-semiconductor-chip vias and store the test data transferred through the plurality of through-semiconductor-chip vias and the latching units of a selected one of the semiconductor chips are configured to transfer the stored data to at least one test-dedicated through-semiconductor-chip via,
wherein the plurality of latching units are each coupled to receive, from a respective one of the plurality of through-semiconductor-chip vias, the test data through a signal path extending from the respective through-semiconductor-chip via and the signal path does not pass through any of the plurality of latching units.

6. The semiconductor device of claim 5, wherein the plurality of latching units each comprise a shift register controlled by a clock signal.

7. The semiconductor device of claim 5, wherein the test-dedicated through-semiconductor-chip via is constructed of plural through-semiconductor-chip vias that are connected in parallel and coupled to each other through a plurality of connection lines.

8. A semiconductor device, comprising:
a plurality of semiconductor chips that are stacked; and
a plurality of through-semiconductor-chip vias configured to transfer test data to the plurality of semiconductor chips,
wherein the semiconductor chips each include a plurality of latching units that are assigned to the through-semiconductor-chip vias and store the test data transferred through at least one first test-dedicated through-semiconductor-chip via and that transfer the stored data to at least one second test-dedicated through-semiconductor-chip via, the latching units of a semiconductor chip neighboring a selected semiconductor chip are configured to transfer the stored data through the plurality of through-semiconductor-chip vias, and the latching units of the selected semiconductor chip are configured to store the transferred data from the neighboring semiconductor chip,
wherein the plurality of latching units are each coupled to receive, from a respective one of the plurality of through-semiconductor-chip vias, the test data through a signal path extending from the respective through-semiconductor-chip via and the signal path does not pass through any of the plurality of latching units.

9. The semiconductor device of claim 8, wherein the plurality of latching units each comprise a shift register controlled by a clock signal.

10. The semiconductor device of claim 8, wherein each of the first and second test-dedicated through-semiconductor-chip vias includes plural through-semiconductor-chip vias that are connected in parallel and coupled to each other through a plurality of connection lines.

11. A method for driving a semiconductor device, the method comprising:
outputting data stored in a first latching unit of a first semiconductor chip to a first through-semiconductor-chip via connecting the first semiconductor chip and a second semiconductor chip in response to a clock signal; and
storing the data transferred through the first through-semiconductor-chip via in a first latching unit of the second semiconductor chip in response to the clock signal,
wherein the first and second semiconductor chips each include additional latching units and the latching units of the first and second semiconductor chips are each coupled to receive, from a respective one of a plurality of through-semiconductor-chip vias, data transferred through a signal path extending from the respective through-semiconductor-chip via and the signal path does not pass through any of the plurality of latching units.

12. The method of claim 11, further comprising:
transferring the data stored in the first latching unit of the second semiconductor chip to a second latching unit of the second semiconductor chip in response to the clock signal;
outputting the data transferred to the second latching unit of the second semiconductor chip to a second through-semiconductor-chip via connecting the first semiconductor chip and the second semiconductor in response to the clock signal; and
storing the data transferred through the second through-semiconductor-chip via in a second latching unit of the first semiconductor chip in response to the clock signal.

13. A method for driving a semiconductor device, the method comprising:
outputting data stored in a plurality of latching units of a first semiconductor chip to a plurality of through-semiconductor-chip vias connecting the first semiconductor chip and a second semiconductor chip in response to a clock signal;
storing the data transferred through the plurality of through-semiconductor-chip vias in a plurality of latching units of the second semiconductor chip in response to the clock signal; and
sequentially transferring the data stored in the plurality of latching units of the second semiconductor chip to a test-dedicated through-semiconductor-chip via in response to the clock signal,
wherein the plurality of latching units are each coupled to receive, from a respective one of the plurality of through-semiconductor-chip vias, the data through a signal path extending from the respective through-semiconductor-chip via and the signal path does not pass through any of the plurality of latching units.

* * * * *